(12) United States Patent
Takekida

(10) Patent No.: US 9,830,961 B2
(45) Date of Patent: Nov. 28, 2017

(54) NONVOLATILE SEMICONDUCTOR STORAGE DEVICE INCLUDING A DISCHARGE TRANSISTOR FOR DISCHARGING A BIT LINE TO A SOURCE LINE

(71) Applicant: Toshiba Memory Corporation, Minato-ku (JP)

(72) Inventor: Hideto Takekida, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/010,775

(22) Filed: Jan. 29, 2016

(65) Prior Publication Data

US 2017/0092362 A1    Mar. 30, 2017

Related U.S. Application Data

(60) Provisional application No. 62/234,221, filed on Sep. 29, 2015.

(51) Int. Cl.
| | | |
|---|---|---|
| G11C 7/00 | (2006.01) | |
| G11C 7/12 | (2006.01) | |
| G11C 16/04 | (2006.01) | |
| G11C 16/34 | (2006.01) | |
| G11C 16/24 | (2006.01) | |

(52) U.S. Cl.
CPC ............ *G11C 7/12* (2013.01); *G11C 16/0483* (2013.01); *G11C 16/24* (2013.01); *G11C 16/3459* (2013.01)

(58) Field of Classification Search
CPC . G11C 16/0483; G11C 16/24; G11C 16/3459; G11C 7/12
See application file for complete search history.

(56) References Cited

U.S. PATENT DOCUMENTS

| | | | |
|---|---|---|---|
| 6,411,548 B1 * | 6/2002 | Sakui | G11C 11/22 257/E27.103 |
| 8,503,248 B2 | 8/2013 | Otsuka et al. | |
| 2010/0110789 A1 * | 5/2010 | Chandrasekhar | G11C 11/5642 365/185.03 |
| 2011/0235416 A1 * | 9/2011 | Otsuka | G11C 16/0483 365/185.11 |

(Continued)

FOREIGN PATENT DOCUMENTS

| | | |
|---|---|---|
| JP | 2011-198437 | 10/2011 |
| JP | 2013-232262 | 11/2013 |
| JP | 2014-56898 | 3/2014 |

*Primary Examiner* — Kretelia Graham
(74) *Attorney, Agent, or Firm* — Oblon, McClelland, Maier & Neustadt, L.L.P.

(57) ABSTRACT

A nonvolatile semiconductor storage device a memory cell array including a plurality of memory cell units arranged in a matrix configuration, the memory cell units including a memory string including a series connection of a plurality of memory cells that stores data in accordance with a threshold voltage and is capable of electrical data writing and erasure, a first select gate transistor that connects a first end of the memory string to a bit line and a second select gate transistor that connects a second end of the memory string to a source line. The nonvolatile semiconductor storage device a discharge transistor that is connected between the bit line and the source line and causes discharge of the bit line to the source line.

14 Claims, 11 Drawing Sheets

(56) References Cited

U.S. PATENT DOCUMENTS

2013/0286748 A1* 10/2013 Sako ................... G11C 16/24
                                                365/185.25
2014/0043907 A1*  2/2014 Fujimura ............. G11C 16/26
                                                365/185.11
2014/0071759 A1   3/2014 Nomura et al.

* cited by examiner

NONVOLATILE SEMICONDUCTOR STORAGE DEVICE INCLUDING A DISCHARGE TRANSISTOR FOR DISCHARGING A BIT LINE TO A SOURCE LINE

CROSS-REFERENCE TO RELATED APPLICATION

This application is based upon and claims the benefit of U.S. provisional Application No. 62/234,221, filed on Sep. 29, 2015, the entire contents of which are incorporated herein by reference.

FIELD

An embodiment relates to a nonvolatile semiconductor storage device and a method of manufacturing the same nonvolatile semiconductor storage device.

BACKGROUND

Memory cells in recent NAND flash memories are increasingly finer, and bit lines to pass a current to the memory cells are arranged at increasingly narrower pitches. As a result, the resistance and capacitance of the bit lines are not ignorable.

In particular, with many NAND flash memories, the bit lines are generally longer than the word lines, and a current needs to be passed through the diffusion layer of the memory cells. As the memory cells become finer, the wire width and the wire interval become smaller, so that the resistance and capacitance of the bit lines become higher, and therefore, the time required for charging and discharging of the bit lines of the NAND flash memories is increasing.

Since the time required for charging and discharging of the bit lines is increasing, the NAND flash memories have a problem that the time required for writing and reading of the memory cells is increasing.

DETAILED DESCRIPTION

A nonvolatile semiconductor storage device according to an embodiment includes a memory cell array including a plurality of memory cell units arranged in a matrix configuration, the memory cell units including a memory string including a series connection of a plurality of memory cells that stores data in accordance with a threshold voltage and is capable of electrical data writing and erasure, a first select gate transistor that connects a first end of the memory string to a bit line and a second select gate transistor that connects a second end of the memory string to a source line. The nonvolatile semiconductor storage device a discharge transistor that is connected between the bit line and the source line and causes discharge of the bit line to the source line.

DETAILED DESCRIPTION OF THE INVENTION

In the following, an embodiment will be described with reference to the drawings.

First Embodiment

Figure 1:
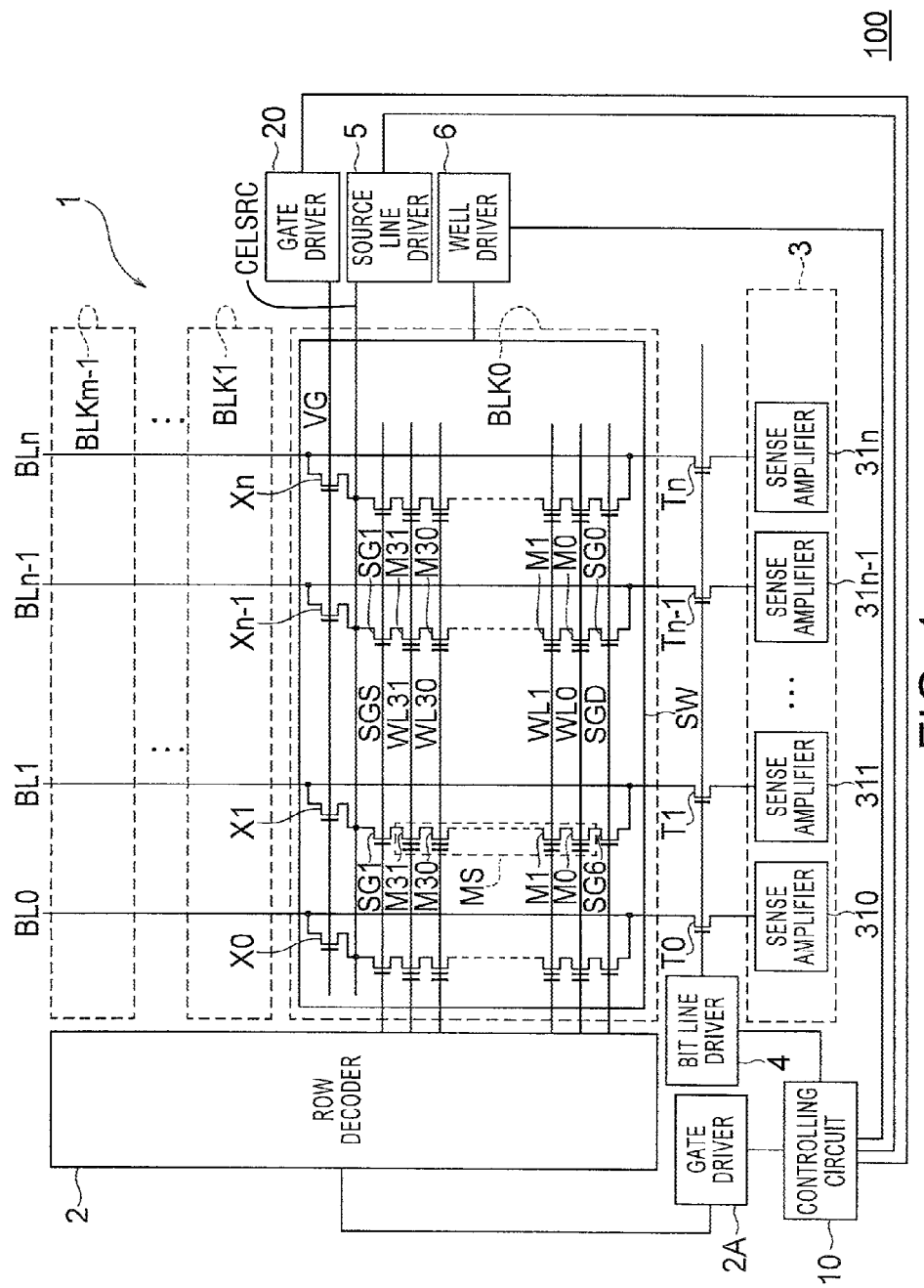
FIG. 1 is a block diagram showing an example of a configuration of a NAND flash memory 100 according to a first embodiment, which is an aspect of the present invention.

FIG. 1 is a block diagram showing an example of a configuration of a NAND flash memory 100 according to a first embodiment, which is an aspect of the present invention.

As shown in FIG. 1, the NAND flash memory (nonvolatile semiconductor storage device) 100 includes a memory cell array 1, a row decoder 2, a word line driver 2A, a sense amplifier circuit 3, a bit line driver 4, a source line driver 5, a well driver 6, a gate driver 20, clamp transistors "T0" to "Tn" ("n" denotes a positive integer), discharge transistors "X0" to "Xn", and a controlling circuit 10.

The memory cell array 1 includes a plurality of bit lines "BL0" to "BLn", a plurality of word lines "WL0" to "WL31", and a source line "CELSRC". The memory cell array 1 is composed of a plurality of NAND cell blocks "BLK0" to "BLKm−1" ("m" denotes a positive integer), each of which includes a matrix arrangement of electrically data rewritable memory cells "M" ("M0" to "M31"), which are formed by EEPROM cells, for example.

A NAND cell unit is composed of a column of a plurality of memory cells (memory cell transistors) "M" ("M0" to "M31") that are connected in series with each other in such a manner that adjacent cells share their source and drain, and select gate transistors "SG0" and "SG1" that are connected to the opposite ends of the series connection of cells.

The memory cell array 1 is composed by a matrix arrangement of such NAND cell units. The NAND cell block "BLK0" to "BLKm−1" described above is composed of a row of NAND cell units. Gates of the select gate transistors "SG0" arranged in the same row are connected to a same select gate line, and control gates of the memory cells "M" arranged in the same row are connected to a same control gate line.

In the example shown in FIG. 1, the memory cell array 1 includes an array of memory strings "MS" each of which is a series connection of 32 electrically data rewritable memory cells "M0" to "M31". Note that the number of memory cells "M" in one memory string "MS" is not limited to 32 but can be 64 or 128, for example.

A drain-side select gate transistor "SG0" and a source-side select gate transistor "SG1", which become conductive when the memory string "MS" is selected, are connected to the opposite ends of the memory string "MS". In the example shown in FIG. 1, the NAND cell unit described above is composed of the 32 memory cells "M0" to "M31" and the two select gate transistors "SG0" and "SG1".

That is, each NAND cell unit is connected to the bit line "BL" ("BL0" to "BLn") at one end of the drain-side select gate transistor "SG0" and to the source line "CELSRC" at one end of the source-side select gate transistor "SG1".

The control gates of the memory cells "M0" to "M31" in the NAND cell unit are connected to different word lines "WL0" to "WL31". The gates of the select gate transistors "SG0" and "SG1" are connected to select gate lines "SGD" and "SGS" that are parallel with the word lines "WL0" to "WL31".

The word lines WL ("WL0" to "WL31") and the select gate lines "SGD" and "SGS" are selectively driven by an output of the word line driver 2A and the row decoder 2.

The bit lines "BL0" to "BLn" are connected to sense amplifiers 310 to 31n in the sense amplifier circuit 3, respectively. In a reading operation, the bit lines "BL0" to "BLn" are charged to a predetermined voltage by a pre-charging circuit (not shown) in the sense amplifiers 310 to 31n. The clamp transistors "T0" to "Tn" are connected between the bit lines "BL" and the sense amplifiers 310 to 31n, and the gate voltages of the clamp transistors "T0" to "Tn" are controlled by the bit line driver 4.

In this example, the bit lines "BL0" to "BLn" are shown as being connected to the sense amplifiers 310 to 31n in a one-to-one relationship. In this case, the memory cells "M" selected by one word line constitute one page of memory cells to be written/read at the same time. Alternatively, an even-numbered bit line and an odd-numbered bit line adjacent to each other may share one sense amplifier. In that case, half of the memory cells selected by one word line constitute a unit (page) of simultaneous writing/reading.

A set of NAND cell units that share one word line constitutes a block that is a unit of data erasure. In the example shown in FIG. 1, a plurality of blocks "BLK0", "BLK1", . . . "BLKm−1" are arranged in the direction of the bit lines "BL" ("BL0" to "BLn").

Figure 2:
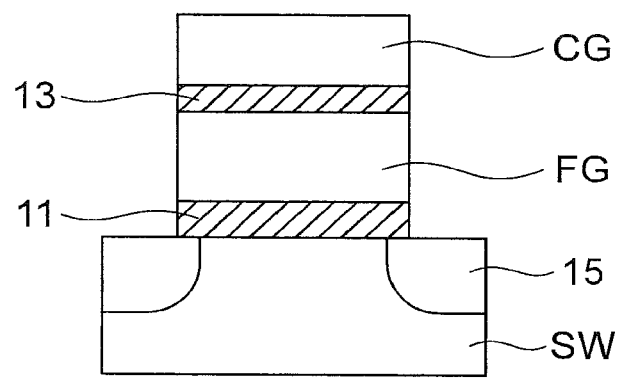
FIG. 2 is a cross-sectional view showing a cross section of one memory cell "M" of the memory cell array 1 shown in FIG. 1.

FIG. 2 is a cross-sectional view showing a cross section of one memory cell "M" of the memory cell array 1 shown in FIG. 1.

As shown in FIG. 2, the memory cell "M" has a floating gate "FG", a control gate "CG" ("WL") and a diffusion layer 15. The control gate "CG" is electrically connected to the word line "WL" and shared among a plurality of memory cells "M".

In a well (p well in this example) "SW" formed in a semiconductor substrate (not shown), the diffusion layer 15, which is a source/drain diffusion layer (n+ diffusion layer) of the memory cell "M", is formed. A gate insulating film (tunnel insulating film) 11 is provided on the substrate (well "SW"). The floating gate (charge storage layer) "FG" is provided on the gate insulating film (tunnel insulating film) 11. The gate insulating film (intermediate insulating film) 13 is provided on the floating gate "FG". The control gate "CG" is provided on the gate insulating film (intermediate insulating film) 13.

The memory cell "M" stores data in accordance with a threshold voltage, and the data stored in the memory cell "M" can be rewritten by controlling the threshold voltage. The threshold voltage depends on the amount of charge stored in the floating gate "FG". The amount of charge in the floating gate "FG" can be changed by changing a tunnel current passing through the gate insulating film 11.

That is, if the voltage of the control gate "CG" is set sufficiently high with respect to the voltage of the well "SW" and the diffusion layer (source diffusion layer/drain diffusion layer) 15, electrons are implanted into the floating gate "FG" through the gate insulating film 11. As a result, the threshold voltage of the memory cell "M" increases (if binary data is stored, for example, this state corresponds to the written state).

On the other hand, if the voltage of the well "SW" and the diffusion layer (source diffusion layer/drain diffusion layer) 15 is set sufficiently high with respect to the voltage of the control gate "CG", electrons are released from the floating gate "FG" through the gate insulating film 11. As a result, the threshold voltage of the memory cell "M" decreases (if binary data is stored, for example, this state corresponds to the erased state).

As described above, data stored in the memory cell "M" can be rewritten by controlling the amount of charge stored in the floating gate "FG".

In the example shown in FIG. 2, the memory cell "M" is a floating gate-type memory cell. However, the memory cell "M" may be a MONOS-type memory cell that has a charge storage layer formed by a silicon nitride film or the like, for example, rather than the floating gate-type memory cell.

As shown in FIG. 1, the sense amplifier circuit 3 that controls the voltage of the bit lines and the row decoder 2 that controls the voltage of the word line are connected to the memory cell array 1. In a data erasure operation, a block is selected by the row decoder 2, the remaining blocks are left unselected. In accordance with the output of the word line driver 2A controlled by the controlling circuit 10, the row decoder 2 applies a voltage required for reading, writing or erasure to the word line of the memory cell array 1.

The sense amplifier circuit 3 includes the sense amplifiers 310 to 31$n$.

The sense amplifiers 310 to 31$n$ sense-amplify the voltage of the bit lines "BL0" to "BLn" in the memory cell array 1. The sense amplifiers 310 to 31$n$ include a data latch circuit that latches data to be written.

The sense amplifier circuit 3 reads data from a memory cell "M" in the memory cell array 1 via the bit line "BL", detects the state of the memory cell "M" via the bit line "BL", or writes data to the memory cell "M" by applying a write controlling voltage to the memory cell "M" via the bit line "BL".

Furthermore, a column decoder (not shown) and a data input/output buffer (not shown) are connected to the sense amplifier circuit 3. The column decoder selects from among the data latch circuits in the sense amplifier circuit 3. The data of the memory cell transistor is read from the selected data latch circuit and output to the outside via the data input/output buffer (not shown).

Externally input data to be written is stored in the data latch circuit selected by the column decoder via the data input/output buffer (not shown).

As described above, the source line driver 5 is connected to the memory cell array 1. The source line driver 5 is configured to control the voltage of the source line "CELSRC".

As described above, the well driver 6 is connected to the memory cell array 1. The well driver 6 is configured to control the voltage of the semiconductor substrate (well "SW") on which the memory cells "M" are formed.

When performing a negative sense scheme, the source line driver 5 and the well driver 6 raise a voltage "VCELSRC" of the source line "CELSRC" and a voltage "Vwell" of the well "SW" to a voltage "VCELSRC" (>0) and a voltage "Vwell" (Vwell>0, VCELSRC≥Vwell), respectively. To avoid application of a substrate bias, the voltage "Vwell" is set to be equal to or smaller than the voltage "VCELSRC".

The discharge transistors "X0" to "Xn" are connected between the bit lines "BL0" to "BLn" and the source line "CELSRC". The discharge transistors "X0" to "Xn" cause discharge of the bit lines "BL0" to "BLn" to the source line "CELSRC".

The discharge transistors "X0" to "Xn" may be replaced with a single discharge transistor. In the case where there are separate discharge transistors "X0" to "Xn", all the discharge transistors "X0" to "Xn" are synchronously turned on and off under the control of the gate driver 20, for example.

The gate driver 20 is connected to a gate line "VG", to which gates of the discharge transistors "X0" to "Xn" are connected, and controls the gate voltages of the discharge transistors "X0" to "Xn".

The source line "CELSRC" is provided in a first wiring layer, which is located at a higher level than the substrate (well "SW") on which the memory cells "M" are provided.

The bit lines "BL" ("BL0" to "BLn") are provided in a second wiring layer, which is located at a higher level than the first wiring layer described above.

The discharge transistors "X0" to "Xn" are provided between the first wiring layer (source line "CELSRC") described above and the second wiring layer (bit lines "BL") described above.

Figure 3:
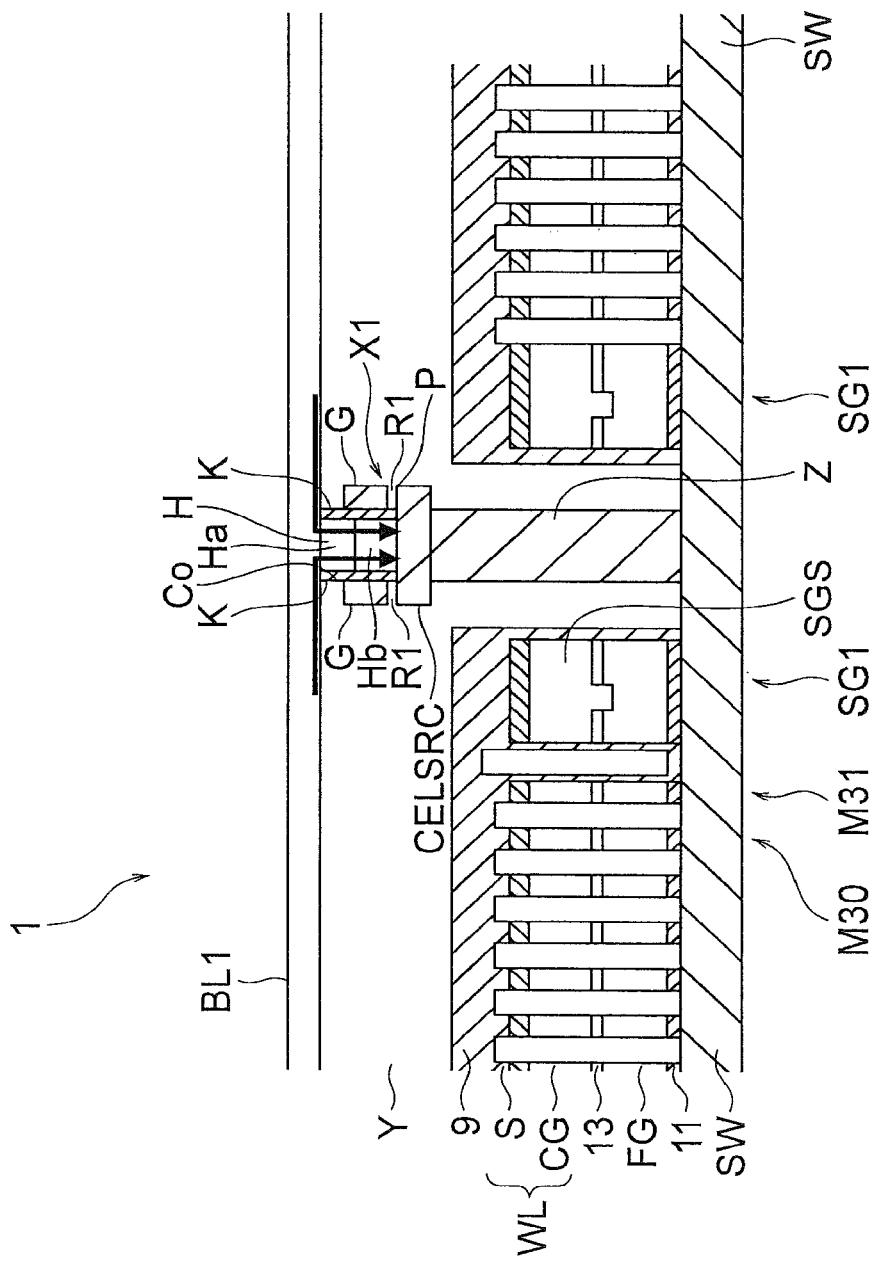
FIG. 3 is a cross-sectional view of the discharge transistor "X1" and a vicinity thereof of the NAND flash memory 100 shown in FIG. 1 taken along the bit line "BL1"

FIG. 3 is a cross-sectional view of the discharge transistor "X1" and a vicinity thereof of the NAND flash memory 100 shown in FIG. 1 taken along the bit line "BL1". Cross sections taken along the other bit lines "BL0" and "BL2" to "BLn" are similar to this cross section.

The discharge transistor "X1" has a gate insulating film "K", a semiconductor layer "H", and a gate electrode "G".

The gate insulating film "K" is provided on a side surface of a contact hole "CO" that connects a contact plug "P" on an upper part of the source line "CELSRC" and the bit line "BL1" that is located above the contact plug "P".

The semiconductor layer "H" is provided in the contact hole "CO" with the gate insulating film "K" interposed between the semiconductor layer "H" and the side surface of the contact hole "CO". An impurity is implanted into an upper part "Ha" of the semiconductor layer "H". No impurity is implanted into a lower part "Hb" of the semiconductor layer "H" that is in contact with the contact plug of the source line "CELSRC".

The gate electrode "G" is disposed around the contact hole "CO" and is adjacent to the semiconductor layer "H" with the gate insulating film "K" interposed therebetween. The gate electrode "G" contains tungsten (W), for example.

A first insulating film "R1" is provided between the contact plug "P" and the gate electrode "G". The first insulating film "R1" insulates the contact plug "P" and the gate electrode "G" from each other.

The discharge transistor "X1" is turned on by a voltage "VSGT" equal to or higher than the threshold voltage being applied to the gate electrode "G". Then, a current flows between the source line "CELSRC" and the bit line "BL1" through the semiconductor layer "H".

The discharge transistors "X0" to "Xn" are disposed to extend in a direction perpendicular to the direction in which the memory string "MS" is arranged (direction in which the bit lines "BL" are arranged) and parallel to the direction in which the select gate line "SGS" connected to the second select gate transistors "SG1" is arranged (direction in which the word lines "WL" are arranged).

A silicide layer "S" and a nitride film 9 are provided on the control gate "CG" of each of the memory cells "M30" and "M31". The select gate transistor "SG1" and the memory cells "M30" and "M31" are covered with an interlayer insulating film "Y" on the substrate (well "SW").

The controlling circuit 10 performs a control operation in response to a control signal (a command latch enable signal, an address latch enable signal, a ready/busy signal or the like) and a command that are externally input. That is, the controlling circuit 10 generates a desired voltage for programming, verification, reading or erasure of data in response to the control signal or command, and supplies the voltage to each part of the memory cell array 1.

In other words, the controlling circuit 10 controls the gate driver 20, the word line driver 2A, the bit line driver 4, the source line driver 5 and the well driver 6, thereby controlling the voltages applied to the gate line, the word lines "WL0" to "WLn", the bit lines "BL0" to "BLn", the source line "CELSRC" and the well "SW".

In particular, if a write verification operation for determining whether or not a write operation is completed is to be performed after completion of a write operation, the controlling circuit 10 is configured to perform the write verification operation after temporarily raising the voltage of the bit line or the source line to a light erasure voltage that is higher than the voltage applied to the bit line or the source line in the write verification operation.

Next, an example of an operation of the NAND flash memory 100 configured as described above will be described.

Figure 4:
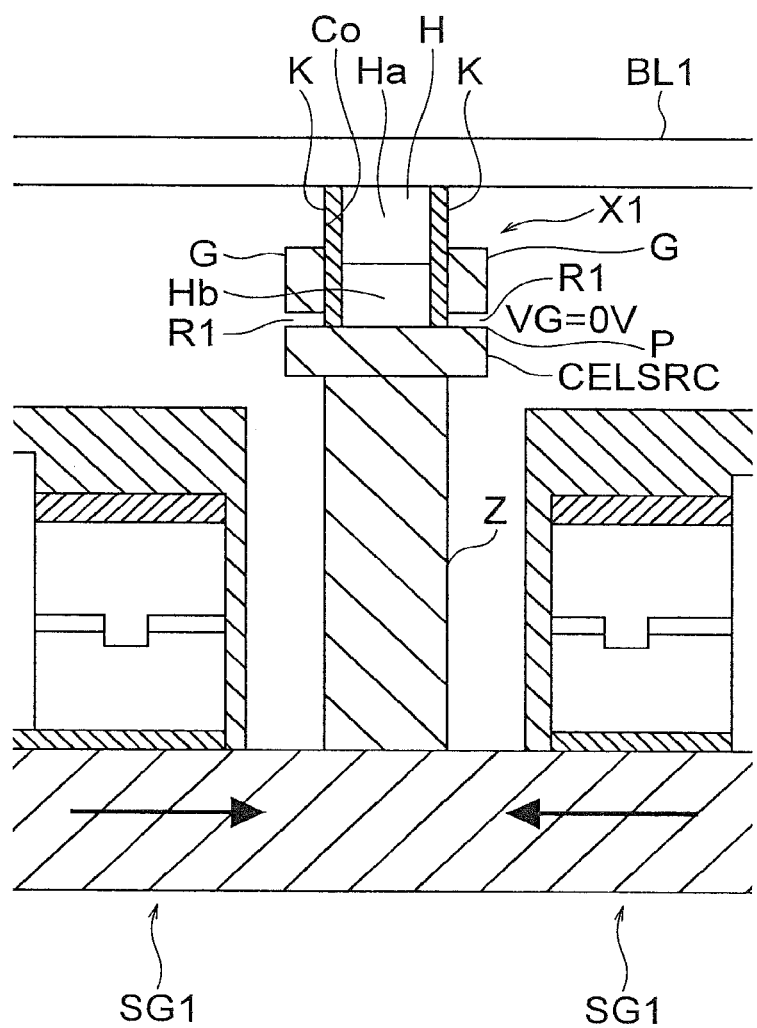
FIG. 4 is a diagram showing an example of a configuration of the discharge transistor "X1" shown in FIGS. 1 and 3 and a vicinity thereof in a normal operation.
Figure 5:
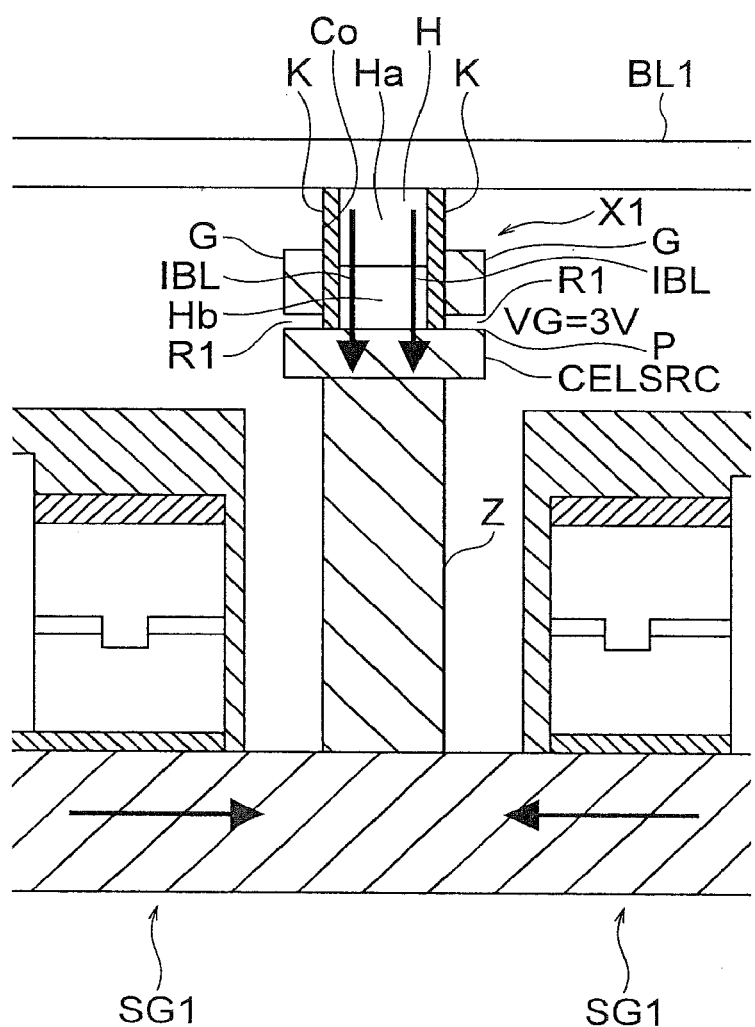
FIG. 5 is a diagram showing an example of a configuration of the discharge transistor "X1" shown in FIGS. 1 and 3 and the vicinity thereof during discharge of the bit line.

FIG. 4 is a diagram showing an example of a configuration of the discharge transistor "X1" shown in FIGS. 1 and 3 and a vicinity thereof in a normal operation. FIG. 5 is a diagram showing an example of a configuration of the discharge transistor "X1" shown in FIGS. 1 and 3 and the vicinity thereof during discharge of the bit line.

As shown in FIG. 4, in the normal operation, the voltage of the gate line "VG" connected to the gate of the discharge transistor "X1" is set at 0V under the control of the gate driver 20, and the discharge transistor "X1" is in an off state.

As a result, the connection between the bit line "BL1" and the source line "CELSRC" is interrupted. In other words, no current flows (no discharge occurs) between the bit line "BL1" and the source line "CELSRC" through the discharge transistor "X1".

On the other hand, during discharge of the bit line "BL1", as shown in FIG. 5, the gate voltage of the gate line "VG" connected to the gate of the discharge transistor "X1" is set at 3V (approximately 2V to 4 v) under the control of the gate driver 20, and the discharge transistor "X1" is in an on state. During discharge of the bit line "BL1", the select gate transistor "SG1" is in the off state.

It is assumed here that the voltage of the source line "CELSRC" is set at 0V under the control of the source line driver 5 (that is, the source line "CELSRC" is grounded). Then, if the discharge transistor "X1" is turned on, conduction (electrical connection) is established between the bit line "BL1" and the source line "CELSRC", and the bit line "BL1" is discharged to the source line "CELSRC" (a current "IBL" flows).

Figure 6:
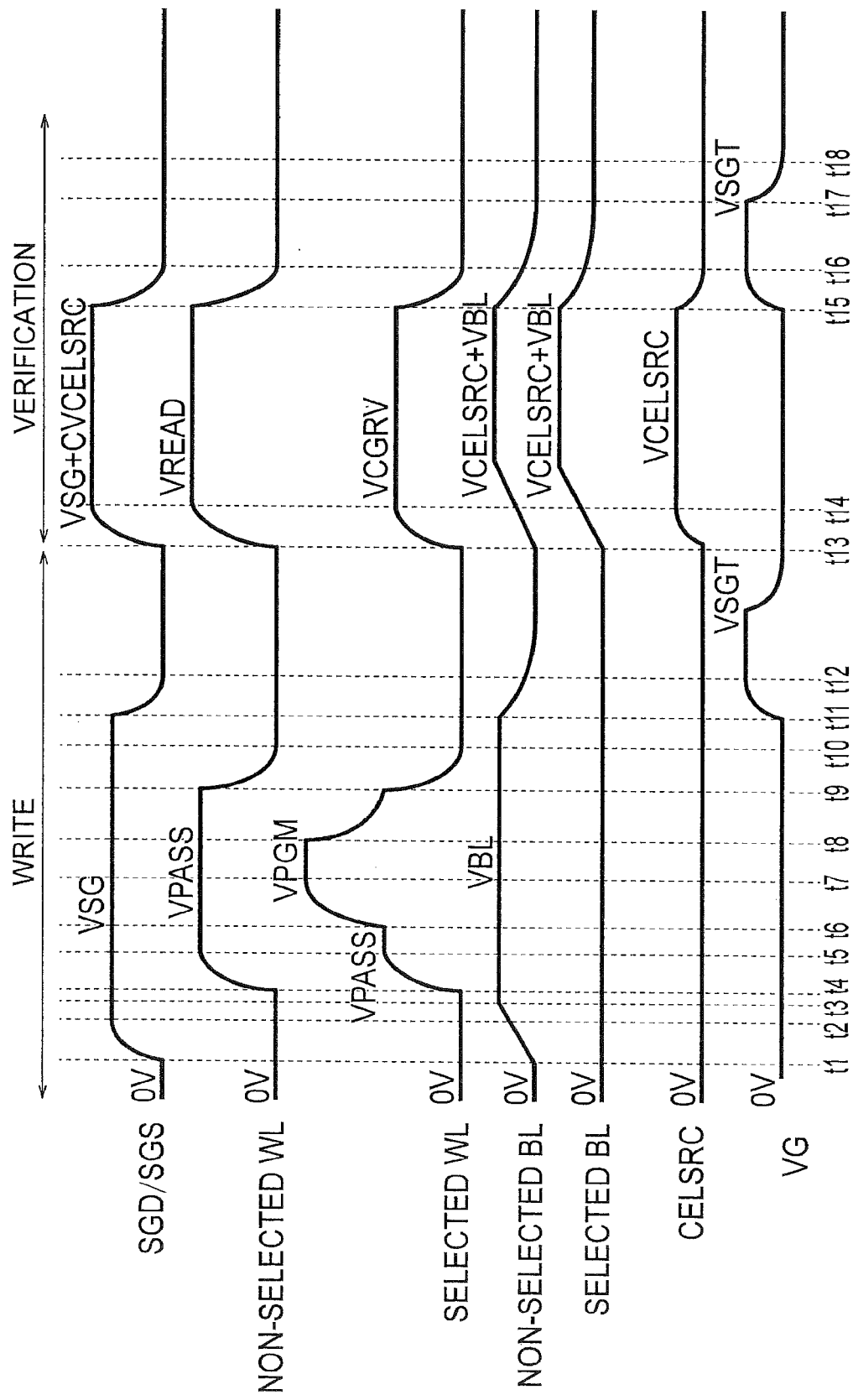
FIG. 6 is a timing chart showing an example of waveforms involved in the write operation and the verification operation of the NAND flash memory 100 shown in FIG. 1.

FIG. 6 is a timing chart showing an example of waveforms involved in the write operation and the verification operation of the NAND flash memory 100 shown in FIG. 1.

The part of the timing chart of FIG. 6 from a time "t1" to a time "t12" relates to the write operation of the memory cell "M", and the part from a time "t13" relates to the verification operation.

In this example, it is assumed that the bit line "BL1" in FIG. 1 is a selected bit line "BL", which is selected for writing, and the selected bit line is denoted as "selected BL" in FIG. 6. And it is assumed that the bit lines "BL0" and "BL2" to "BLn" in FIG. 1 are non-selected bit lines "BL", which are not selected for writing, and the non-selected bit lines are denoted as "non-selected BL" in FIG. 6. A selected word line "WL" is denoted as "selected WL" in FIG. 6. A non-selected word line "WL" is denoted as "non-selected WL" in FIG. 6. And in this example, it is assumed that the memory cells "M0" and "M2" to "M31" in FIG. 1 are non-selected memory cells "M", which are not the target of writing. And in this example, it is assumed that the memory cell "M1" in FIG. 1 is a selected memory cell "M", which is a target of writing.

As shown in FIG. 6, in an initial state (before the time "t1"), the voltage of each part is set at 0V.

In a period from the time "t1" to a time "t2", the controlling circuit 10 raises the voltages of the two select gate lines "SGD" and "SGS" from 0V to a voltage "VSG". As a result, the select gate transistors "SG0" and "SG1" are turned on.

In a period from the time "t1" to a time "t3", the controlling circuit 10 raises the voltage of the non-selected bit lines "BL" from 0V to a voltage "VBL" in order to set the other bit lines than the selected bit line "BL", which is selected for writing, to be non-selected bit lines "BL".

The bit lines "BL" have a large wiring capacity, and it takes long to charge the bit lines "BL". Therefore, the rise of the voltage of the bit lines "BL" lags behind the rise of the voltage of the two select gate lines "SGD" and "SGS" (in the period from the time "t1" to the time "t3").

After that, in a period from a time "t4" to a time "t5", the controlling circuit 10 raises the voltages of the selected word line "WL" and the non-selected word line "WL" from 0V to a write pass voltage "VPASS".

That is, during data writing of the selected memory cell "M", the voltages of the word lines "WL" connected to the control gates of the non-selected memory cells "M", which are not selected, of the plurality of memory cells "M" are set at the write pass voltage "VPASS".

In this way, a channel voltage of the non-selected memory cells "M", which are not the target of writing, is boosted, and the non-selected memory cells "M" are not written.

In a period from a time "t6" to a time "t7", the controlling circuit 10 applies a write voltage "VPGM" that is higher than the write pass voltage "VPASS" to the selected word line "WL" connected to the selected memory cell "M" to be written (the memory cell "M1" in FIG. 1 in this example). At this time, the voltage of the source line "CELSRC" is controlled to be 0V.

As a result, a predetermined potential difference is applied to the selected memory cell "M", electrons are implanted to the floating gate "FG" of the selected memory cell "M" from the substrate (well "SW"), and the selected memory cell "M" is written.

After applying the write voltage "VPGM", in a period from a time "t8" to a time "t9", the controlling circuit 10 lowers the voltage of the selected word line "WL" from the write voltage "VPGM" to the write pass voltage "VPASS".

After that, in a period from the time "t9" to a time "t10", the controlling circuit 10 lowers the voltage of the selected word line "WL" from the write pass voltage "VPASS" to 0V.

In addition, at the time "t9", when the controlling circuit 10 lowers the voltage of the selected word line "WL" connected to the control gate of the selected memory cell "M" from the write pass voltage "VPASS", the controlling circuit 10 lowers the voltage of the non-selected word lines "WL" connected to the control gates of the non-selected memory cells "M" from the write pass voltage "VPASS" to 0V.

In this way, the voltage of the non-selected word lines "WL" is temporarily raised to the write pass voltage "VPASS", and the voltage of the selected word line "WL" is lowered to 0V in synchronization with the voltage of the non-selected word lines "WL". Since the voltage of the selected word line "WL" is not lowered in one stroke from the write voltage "VPGM" to 0V, overshooting of the voltage of the selected word line "WL" can be prevented, and therefore breakage of a peripheral transistor (not shown) that transfers the voltage of the word line can be prevented.

In a period from a time "t11" to a time "t12", the controlling circuit 10 lowers the voltage of the non-selected bit lines "BL" to 0V, and lowers the voltages of the select gate lines "SGD" and "SGS" to 0V.

After the write operation of the selected memory cell "M" of the plurality of memory cells "M" is completed (at the time "t11"), the controlling circuit 10 raises the voltage of the gate line "VG" from 0V to the voltage "VSGT", thereby turning on the discharge transistors "X0" to "Xn" to establish the conduction between the bit lines "BL0" to "BLn" and the source line "CELSRC" to cause discharge of the bit lines "BL" (the non-selected bit lines "BL", in particular) to the source line "CELSRC".

After a prescribed period has elapsed since the discharge transistors "X0" to "Xn" are turned on, the controlling circuit 10 lowers the voltage of the gate line "VG" from the voltage "VSGT" to 0V, thereby turning off the discharge transistors "X0" to "Xn" to interrupt the connection between the bit lines "BL0" to "BLn" and the source line.

Alternatively, when the discharge of the bit lines "BL0" to "BLn" is completed, the controlling circuit 10 may lower the voltage of the gate line "VG" from the voltage "VSGT" to 0V, thereby turning off the discharge transistors "X0" to "Xn" to interrupt the connection between the bit lines "BL0" to "BLn" and the source line "CELSRC".

As described above, when the bit lines "BL0" to "BLn" are discharged, the discharge transistors "X0" to "Xn" are turned on to establish the conduction between the bit lines "BL0" to "BLn" and the source line "CELSRC" and cause discharge of the bit lines "BL0" to "BLn" to the source line "CELSRC".

In this way, the rate of discharge of the bit lines can be increased, and the time required for writing of the memory cell can be reduced (the subsequent verification operation or read operation can be started earlier).

After that, the controlling circuit 10 performs the verification operation for the memory cell to be written.

At the time "t13", the controlling circuit 10 raises the voltage of the two select gate lines "SGD" and "SGS" from 0V to a voltage "VSG+CVELSRC" that is higher than the voltage "VSG". As a result, the select gate transistors "SG0" and "SG1" are turned on.

In addition, at the time "t13", the controlling circuit 10 raises the voltage of the selected word line "WL" from 0V to a voltage "VCGRV" and raises the voltage of the non-selected word lines "WL" from 0V to a read voltage "VREAD".

In addition, at the time "t13", the controlling circuit 10 raises the voltages of the selected bit line "BL" and the non-selected bit lines "BL" from 0V to a voltage "VCELSRC+VBL" that is higher than the voltage "VBL" by the voltage "VCELSRC".

In addition, at the time "t13", the controlling circuit 10 raises the voltage of the source line "CELSRC" from 0V to the voltage "VCELSRC".

As described above, in the verification operation, the voltages applied to the selected and non-selected word lines "WL", the voltages applied to the selected and non-selected bit lines "BL" and the voltage applied to the source line "CELSRC" are raised at the same time.

In the negative sense operation, the controlling circuit makes the sense amplifier circuit 3 start sensing and performs the verification operation of the selected memory cell "M" to be written after the voltages of the bit lines "BL" are stabilized.

After the verification operation of the selected memory cell "M" of the plurality of memory cells "M" is completed (at a time "t15"), the controlling circuit 10 raises the voltage of the gate line "VG" from 0V to the voltage "VSGT", thereby turning on the discharge transistors "X0" to "Xn" to establish the conduction between the bit lines "BL0" to "BLn" and the source line "CELSRC" and cause discharge of the bit lines "BL" (the non-selected bit lines "BL", in particular) to the source line "CELSRC".

After a prescribed period has elapsed since the discharge transistor "X0" to "Xn" are turned on, the controlling circuit 10 lowers the voltage of the gate line "VG" from the voltage "VSGT" to 0V, thereby turning off the discharge transistors "X0" to "Xn" and interrupting the connection between the bit lines "BL0" to "BLn" and the source line.

Alternatively, when the discharge of the bit lines "BL0" to "BLn" is completed, the controlling circuit 10 may lower the voltage of the gate line "VG" from the voltage "VSGT" to 0V, thereby turning off the discharge transistors "X0" to "Xn" and interrupting the connection between the bit lines "BL0" to "BLn" and the source line "CELSRC".

As described above, when the bit lines "BL0" to "BLn" are discharged, the discharge transistors "X0" to "Xn" are turned on to establish the conduction between the bit lines "BL0" to "BLn" and the source line "CELSRC" and cause discharge of the bit lines "BL0" to "BLn" to the source line "CELSRC".

In this way, the rate of discharge of the bit lines can be increased, and the time required for verification of the memory cell can be reduced (the subsequent write operation or read operation can be started earlier).

After that, if the desired threshold voltage of the selected memory cell "M" is not reached, the write operation is performed again in the same sequence.

The example of FIG. 6 concerns a case where the negative sense operation is assumed, and the voltage "VCELSRC" is applied to the source line "CELSRC". However, the conventional positive sense operation is also possible by setting the voltage "VCELSRC" at 0V.

The operation of the discharge transistors "X0" to "Xn" after the read operation of the memory cells "M" can be explained in the same manner as the discharge transistors "X0" to "Xn" after the verification operation described above. That is, for example, when the read operation of the selected memory cell "M" of the plurality of memory cells "M" is completed, the controlling circuit 10 raises the voltage of the gate line "VG" from 0V to the voltage "VSGT", thereby turning on the discharge transistors "X0" to "Xn" to establish the conduction between the bit lines "BL0" to "BLn" and the source line "CELSRC" and cause discharge of the bit lines "BL" (the non-selected bit lines "BL", in particular) to the source line "CELSRC".

Next, an example of a method of manufacturing the NAND flash memory 100 having the configuration and functionality described above will be described. FIGS. 7A to 11B are cross-sectional views of the memory cell array taken along the bit line "BL1" in different steps of the method of manufacturing the NAND flash memory 100 shown in FIGS. 1 and 3. The cross sections taken along the other bit lines "BL0" and "BL2" to "BLn" are similar to these cross sections.

First, the memory string and the select gate transistors are formed, and the interlayer insulating film "Y" is then deposited.

Figure 7A:
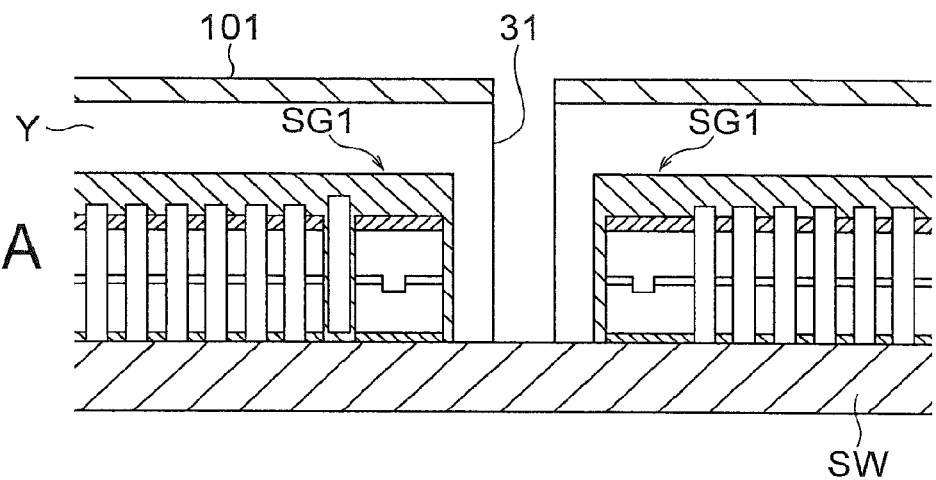
FIG. 7A is a cross-sectional view of the memory cell array taken along the bit line "BL1" in different steps of the method of manufacturing the NAND flash memory 100 shown in FIGS. 1 and 3.

After that, as shown in FIG. 7A, a contact hole 31 is formed between the adjacent two select gate transistors "SG1" to a depth of the upper surface of the substrate by etching the interlayer insulating film "Y" in a reactive ion etching (RIE) process, for example, using a resist film 101 as a mask.

Figure 7B:
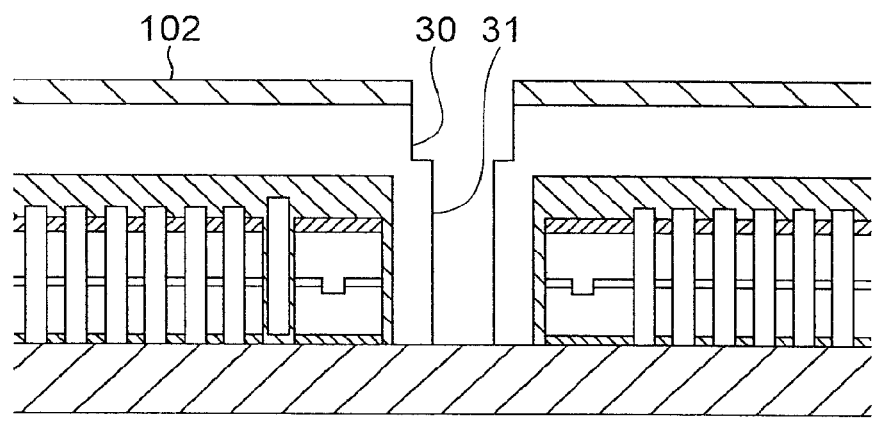
FIG. 7B is a cross-sectional view of the memory cell array taken along the bit line "BL1" in different steps of the method of manufacturing the NAND flash memory 100 shown in FIGS. 1 and 3.

As shown in FIG. 7B, a contact hole 30 having a larger diameter than the contact hole 31 is then formed to a depth where the source line "CELSRC" is formed by etching an upper part of the contact hole 31 in the interlayer insulating film "Y" in the RIE process, for example, using a resist film 102 as a mask.

Figure 7C:
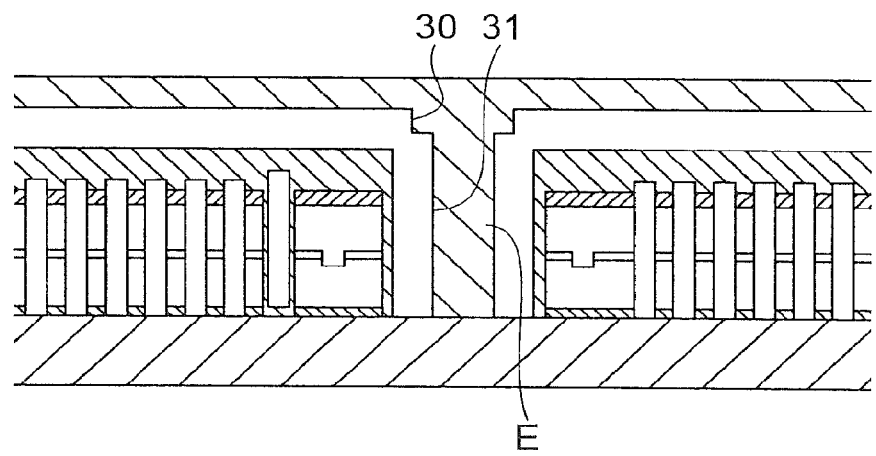
FIG. 7C is a cross-sectional view of the memory cell array taken along the bit line "BL1" in different steps of the method of manufacturing the NAND flash memory 100 shown in FIGS. 1 and 3.

As shown in FIG. 7C, a metal material "E", such as tungsten, is then buried in the contact holes 30 and 31. The metal material "E" contains a barrier metal.

Figure 8A:
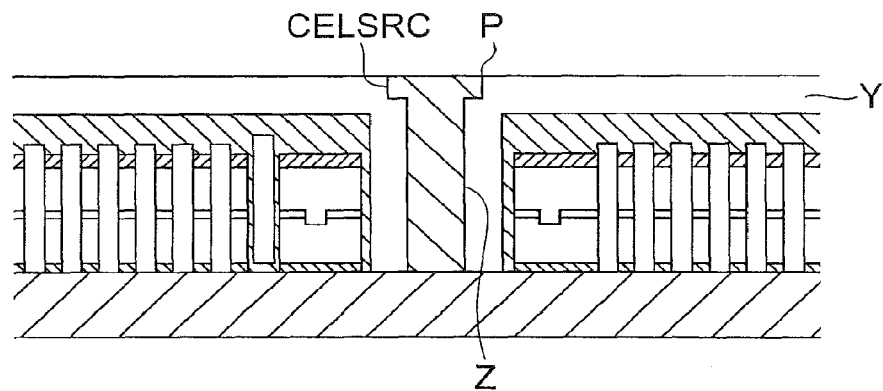
FIG. 8A is a cross-sectional view of the memory cell array taken along the bit line "BL1" in different steps of the method of manufacturing the NAND flash memory 100 shown in FIGS. 1 and 3.

As shown in FIG. 8A, the metal material "E" on the interlayer insulating film "Y" is then removed in a chemical mechanical polishing (CMP) process, for example, so that the upper surface of the interlayer insulating film "Y" is exposed.

In this way, the contact plug "P" for a contact wire "Z" and the source line "CELSRC" is formed on the substrate (well "SW").

Figure 8B:
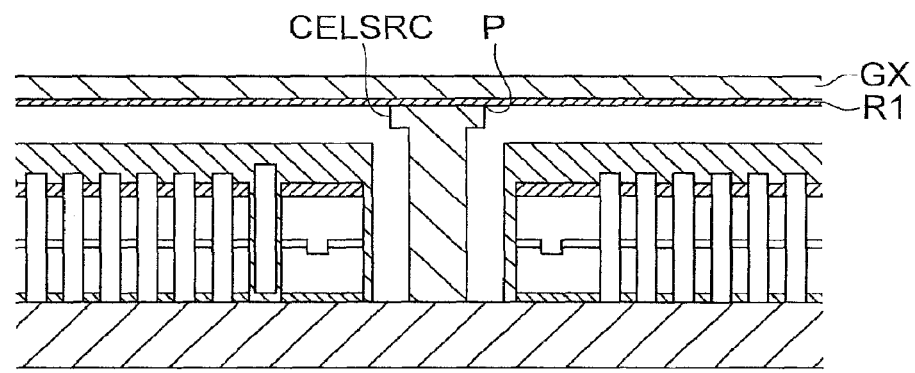
FIG. 8B is a cross-sectional view of the memory cell array taken along the bit line "BL1" in different steps of the method of manufacturing the NAND flash memory 100 shown in FIGS. 1 and 3.

As shown in FIG. 8B, the first insulating film "R1" is then formed on the interlayer insulating film "Y" and the contact plug "P". Furthermore, a metal film "GX" of tungsten or the like is formed on the insulating film "R1".

In this way, the first insulating film "R1" is formed on the contact plug "P" for the source line "CELSRC" provided on the substrate (well "SW"), and the metal film "GX" that forms the gate electrode "G" is formed on the first insulating film "R1".

Figure 8C:
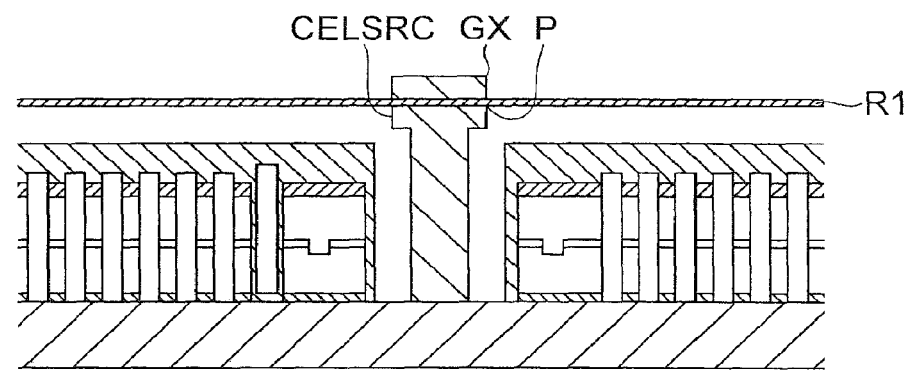
FIG. 8C is a cross-sectional view of the memory cell array taken along the bit line "BL1" in different steps of the method of manufacturing the NAND flash memory 100 shown in FIGS. 1 and 3.

As shown in FIG. 8C, the metal film "GX" on the first insulating film "R1" on the interlayer insulating film "Y" is then selectively removed in the RIE process, for example, so that the metal film "GX" on the first insulating film "R1" on the contact plug "P" remains.

Figure 9A:
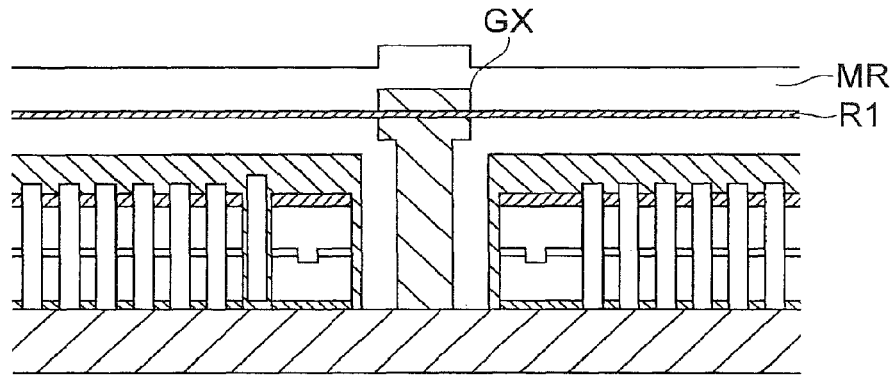
FIG. 9A is a cross-sectional view of the memory cell array taken along the bit line "BL1" in different steps of the method of manufacturing the NAND flash memory 100 shown in FIGS. 1 and 3.

As shown in FIG. 9A, an interlayer insulating film (second insulating film) "MR" is then formed on the metal film "GX" and the first insulating film "R1".

Figure 9B:
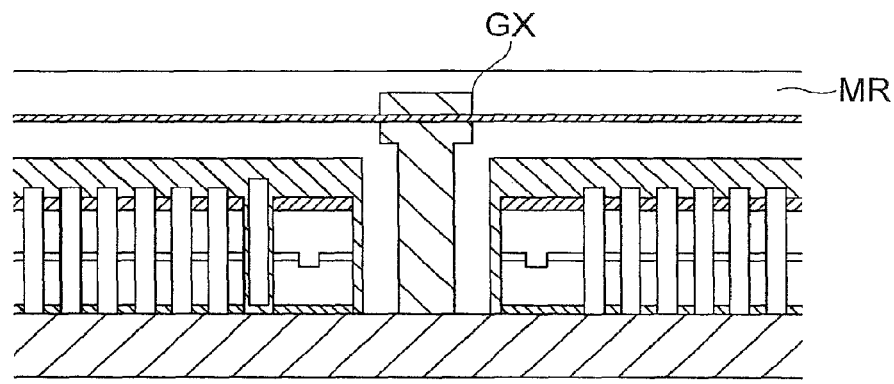
FIG. 9B is a cross-sectional view of the memory cell array taken along the bit line "BL1" in different steps of the method of manufacturing the NAND flash memory 100 shown in FIGS. 1 and 3.

As shown in FIG. 9B, the interlayer insulating film "MR" is then planarized in the CMP process.

Figure 9C:
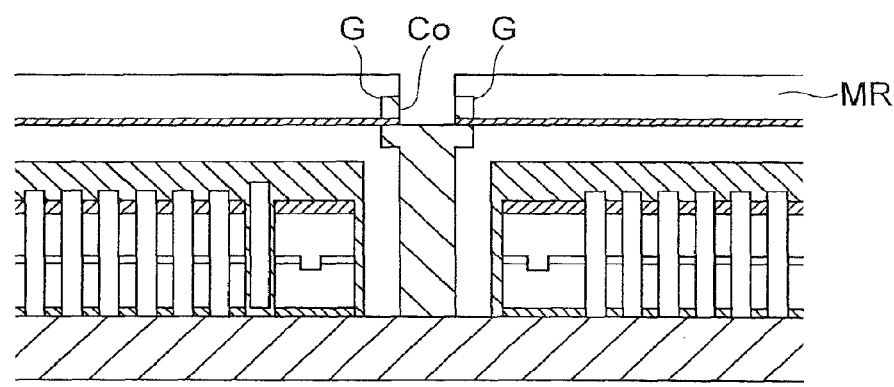
FIG. 9C is a cross-sectional view of the memory cell array taken along the bit line "BL1" in different steps of the method of manufacturing the NAND flash memory 100 shown in FIGS. 1 and 3.

As shown in FIG. 9C, a contact hole "CO" that extends from the upper surface of the interlayer insulating film (second insulating film) "MR" to the upper surface of the contact plug "P" through the metal film "GX" and the first insulating film "R1" is then formed in the RIE process, for example.

An oxide film that forms gates of the transistors is formed. The oxide film on the lower surface is removed by anisotropic etching.

Figure 10A:
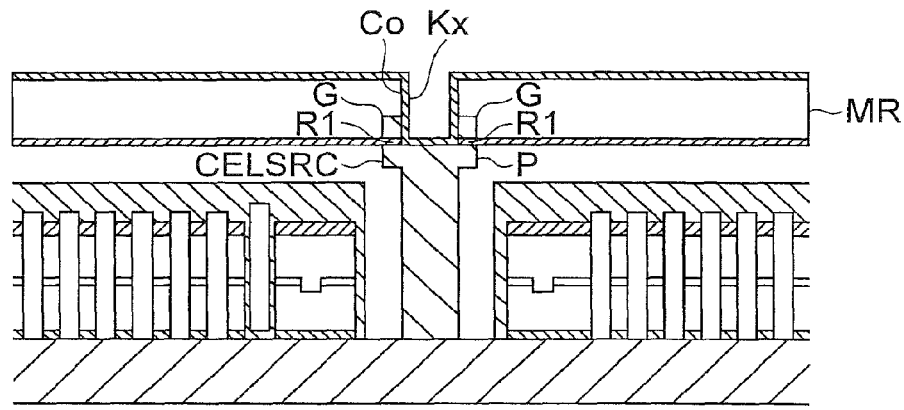
FIG. 10A is a cross-sectional view of the memory cell array taken along the bit line "BL1" in different steps of the method of manufacturing the NAND flash memory 100 shown in FIGS. 1 and 3.

As shown in FIG. 10A, an oxide film "KX" is then formed on the interlayer insulating film "MR" and the inner surface of the contact hole "CO" in a chemical vapor deposition (CVD) process.

Figure 10B:
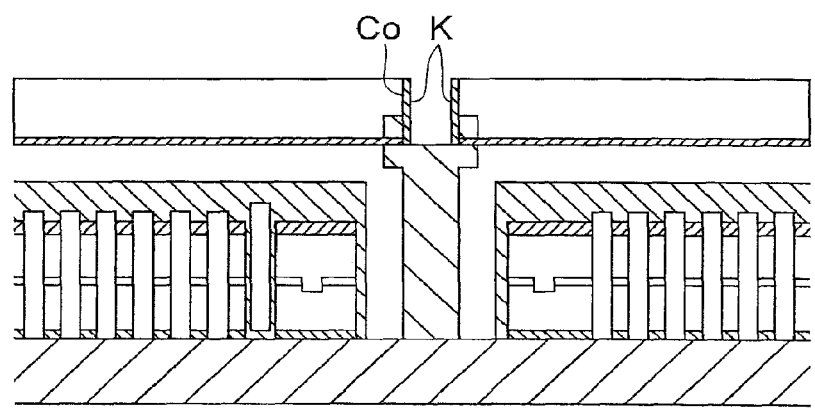
FIG. 10B is a cross-sectional view of the memory cell array taken along the bit line "BL1" in different steps of the method of manufacturing the NAND flash memory 100 shown in FIGS. 1 and 3.

As shown in FIG. 10B, the oxide film "KX" on the contact plug "P" and the interlayer insulating film "MR" are then etched in the RIE process, for example, so that the oxide film on the side wall of the contact hole "CO" selectively remains. In this way, a gate insulating film "K" of the discharge transistor is formed on the side surface of the contact hole "CO".

Figure 10C:
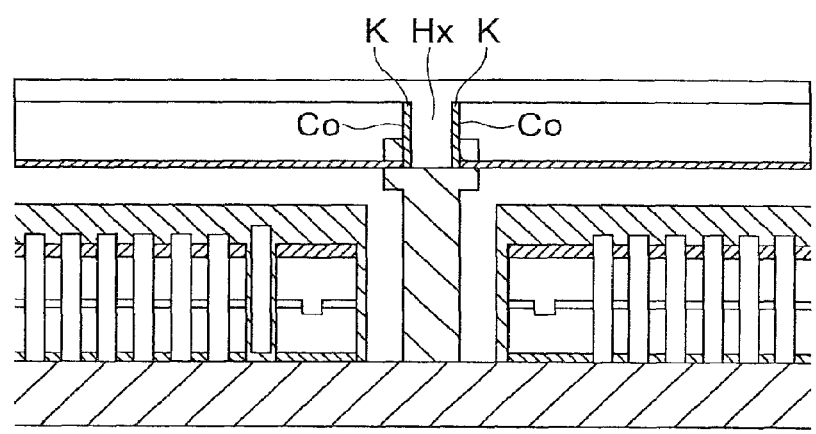
FIG. 10C is a cross-sectional view of the memory cell array taken along the bit line "BL1" in different steps of the method of manufacturing the NAND flash memory 100 shown in FIGS. 1 and 3.

As shown in FIG. 10C, a semiconductor layer "HX" of polysilicon or the like is then buried in the contact hole "CO".

Figure 11A:
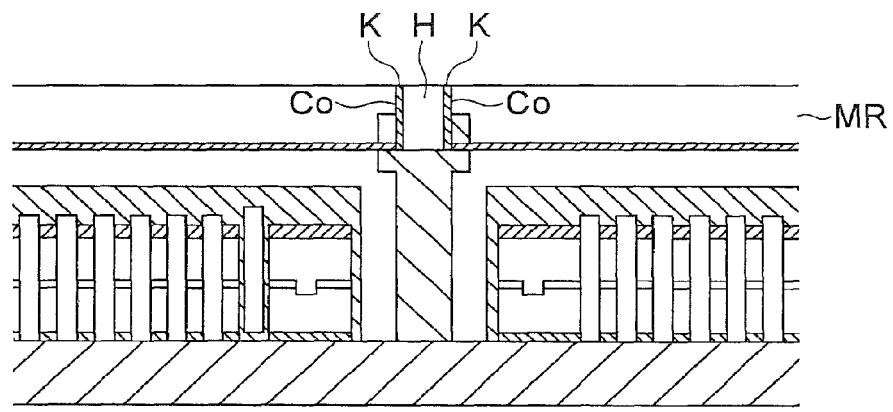
FIG. 11A is a cross-sectional view of the memory cell array taken along the bit line "BL1" in different steps of the method of manufacturing the NAND flash memory 100 shown in FIGS. 1 and 3.

As shown in FIG. 11A, the semiconductor layer "HX" is then planarized in the CMP process, for example, thereby forming a semiconductor layer "H", which is to form a channel layer of the discharge transistor, in the contact hole "CO" with the gate insulating film "K" interposed between the semiconductor layer "HX" and the side surface of the contact hole "CO".

Figure 11B:
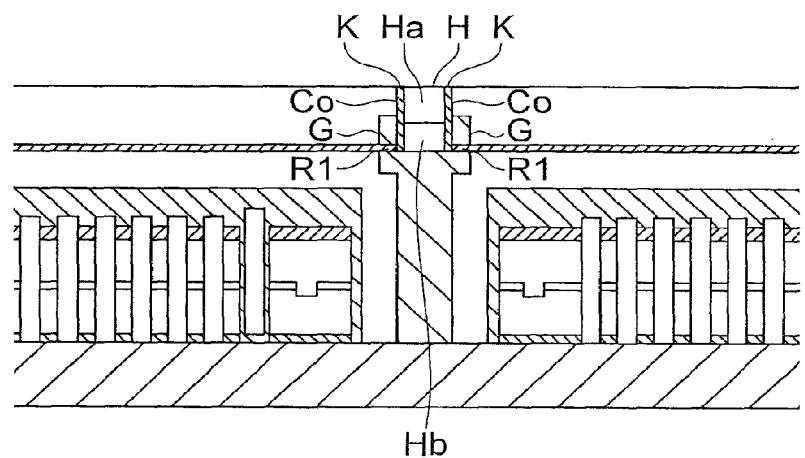
FIG. 11B is a cross-sectional view of the memory cell array taken along the bit line "BL1" in different steps of the method of manufacturing the NAND flash memory 100 shown in FIGS. 1 and 3.

After the semiconductor layer "H" is formed, as shown in FIG. 11B, an impurity is implanted into an upper part of the semiconductor layer "H", thereby forming a diffusion layer "Ha". After the semiconductor layer "H" is formed, no impurity is implanted into the lower part "Hb" of the semiconductor layer "H".

After the impurity implantation, the bit line "BL" electrically connected to the upper part of the semiconductor layer "H" is formed. In this way, the discharge transistor of the NAND flash memory 100 having the structure shown in FIG. 3 described above is completed.

As described above, with the nonvolatile semiconductor storage device according to this embodiment, the rate of discharge of the bit line can be increased to reduce the time required for writing and reading (verification) of the memory cell.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
    a memory cell array including a plurality of memory cell units arranged in a matrix configuration, the memory cell units including a memory string including a series connection of a plurality of memory cells that stores data in accordance with a threshold voltage and is capable of electrical data writing and erasure, a first select gate transistor that connects a first end of the memory string to a bit line and a second select gate transistor that connects a second end of the memory string to a source line; and
    a discharge transistor that is connected between the bit line and the source line and causes discharge of the bit line to the source line,
    wherein the discharge transistor includes:
    a gate insulating film provided on a side surface of a contact hole that connects a contact plug on top of the source line and the bit line located above the contact plug to each other;
    a semiconductor layer provided in the contact hole with the gate insulating film interposed between the semiconductor layer and the side surface of the contact hole; and
    a gate electrode that is disposed around the contact hole and is adjacent to the semiconductor layer with the gate insulating film interposed therebetween.

2. The nonvolatile semiconductor storage device according to claim 1, wherein, when making the bit line discharge, the discharge transistor is turned on to establish conduction between the bit line and the source line to cause discharge of the bit line to the source line.

3. The nonvolatile semiconductor storage device according to claim 1, wherein, when a write operation of a selected memory cell of the plurality of memory cells is completed, the discharge transistor is turned on to establish conduction between the bit line and the source line to cause discharge of the bit line to the source line.

4. The nonvolatile semiconductor storage device according to claim 2, wherein, when the discharge of the bit line is completed, the discharge transistor is turned off and interrupts the conduction between the bit line and the source line.

5. The nonvolatile semiconductor storage device according to claim 3, wherein, when a prescribed period elapses since the discharge transistor is turned on, the discharge transistor is turned off and interrupts the conduction between the bit line and the source line.

6. The nonvolatile semiconductor storage device according to claim 1, wherein, when a verification operation or a read operation of a selected memory cell of the plurality of memory cells is completed, the discharge transistor is turned on to establish conduction between the bit line and the source line to cause discharge of the bit line to the source line.

7. The nonvolatile semiconductor storage device according to claim 6, wherein, when the discharge of the bit line is completed, the discharge transistor is turned off and interrupts the conduction between the bit line and the source line.

8. The nonvolatile semiconductor storage device according to claim 6, wherein, when a prescribed period elapses since the discharge transistor is turned on, the discharge transistor is turned off and interrupts the conduction between the bit line and the source line.

9. The nonvolatile semiconductor storage device according to claim 1, wherein the source line is provided in a first wiring layer that is located above a substrate on which the memory cells are provided,
the bit line is provided in a second wiring layer that is located above the first wiring layer, and
the discharge transistor is provided between the first wiring layer and the second wiring layer.

10. The nonvolatile semiconductor storage device according to claim 1, further comprising a first insulating film provided between the contact plug and the gate electrode.

11. The nonvolatile semiconductor storage device according to claim 1, wherein an impurity is implanted into an upper part of the semiconductor layer.

12. The nonvolatile semiconductor storage device according to claim 11, wherein the impurity is not implanted into a part of the semiconductor layer of the discharge transistor that is in contact with the contact plug of the source line.

13. The nonvolatile semiconductor storage device according to claim 1, wherein discharge transistors are disposed to extend in a direction perpendicular to a direction in which the memory string is arranged and parallel to a direction in which a select gate line connected to the second select gate transistor is arranged.

14. The nonvolatile semiconductor storage device according to claim 1, wherein the nonvolatile semiconductor storage device is a NAND flash memory.

* * * * *